(12) United States Patent
Burton

(10) Patent No.: US 7,332,817 B2
(45) Date of Patent: Feb. 19, 2008

(54) DIE AND DIE-PACKAGE INTERFACE METALLIZATION AND BUMP DESIGN AND ARRANGEMENT

(75) Inventor: Edward A. Burton, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 10/894,967

(22) Filed: Jul. 20, 2004

(65) Prior Publication Data

US 2006/0017172 A1 Jan. 26, 2006

(51) Int. Cl.
- H01L 23/48 (2006.01)
- H01L 23/52 (2006.01)
- H01L 29/40 (2006.01)
- H01L 27/10 (2006.01)
- H01L 29/73 (2006.01)

(52) U.S. Cl. .............. 257/776; 257/207; 257/208; 257/209; 257/210; 257/211; 257/673; 257/690; 257/737; 257/738; 257/773; 257/779; 257/780

(58) Field of Classification Search .......... 257/673, 257/737–738, 780, 207–211, 690, 776, 779, 257/773

See application file for complete search history.

(56) References Cited

U.S. PATENT DOCUMENTS

| | | | |
|---|---|---|---|
| 4,390,377 A * | 6/1983 | Hogg ................... 148/518 |
| 4,843,035 A * | 6/1989 | Takashima ................. 438/51 |
| 4,959,130 A * | 9/1990 | Josowicz et al. ........... 205/210 |
| 5,091,218 A | 2/1992 | Altman et al. |
| 5,109,267 A | 4/1992 | Koblinger et al. |
| 5,438,222 A * | 8/1995 | Yamazaki .................. 257/673 |
| 5,504,017 A | 4/1996 | Yue et al. |
| 5,591,480 A | 1/1997 | Weisman et al. |
| 5,693,181 A * | 12/1997 | Bernstein ................... 438/50 |
| 5,829,124 A | 11/1998 | Kresge et al. |
| 5,924,623 A * | 7/1999 | Kenney ................. 228/180.22 |
| 6,066,808 A | 5/2000 | Kresge et al. |
| 6,107,186 A | 8/2000 | Erb |
| 6,166,441 A * | 12/2000 | Geryk ...................... 257/773 |
| 6,184,576 B1 * | 2/2001 | Jones et al. ................ 257/696 |
| 6,323,526 B1 * | 11/2001 | Saitou et al. .............. 257/401 |
| 6,477,046 B1 * | 11/2002 | Stearns et al. ............. 361/704 |
| 6,570,271 B2 * | 5/2003 | Slupe et al. ................ 307/89 |
| 6,573,445 B1 | 6/2003 | Burgers |
| 6,798,077 B2 * | 9/2004 | Nakamura .................. 257/786 |
| 6,897,561 B2 * | 5/2005 | Nemtsev et al. ............ 257/758 |
| 7,023,094 B2 * | 4/2006 | Suga ........................ 257/774 |
| 7,086,024 B2 * | 8/2006 | Hsu et al. ................... 716/8 |
| 2001/0000927 A1 * | 5/2001 | Rodenbeck et al. ....... 257/778 |
| 2001/0015447 A1 * | 8/2001 | Shinomiya ................ 257/203 |
| 2003/0111717 A1 * | 6/2003 | Ito et al. .................... 257/678 |
| 2005/0067678 A1 * | 3/2005 | Lian et al. ................. 257/673 |

* cited by examiner

Primary Examiner—Ida M. Soward
(74) Attorney, Agent, or Firm—Schwabe, Williamson & Wyatt, P.C.

(57) ABSTRACT

A die metallization and bump design/arrangement, and a die-package interface metallization and bump design/arrangement are described herein.

19 Claims, 3 Drawing Sheets

DIE AND DIE-PACKAGE INTERFACE METALLIZATION AND BUMP DESIGN AND ARRANGEMENT

FIELD OF THE INVENTION

The present invention relates generally to the field of integrated circuits, in particular, to die and die-package interface metallization and bump design/arrangement.

BACKGROUND OF THE INVENTION

With continuing advances in integrated circuit technology, more and more circuits and circuit elements are being packed into a unit area. As a result, the current density for a unit area continues to increase at the rate of 1.5× to 2× for each generation of technology, e.g. from 130 nm to 90 nm. The increase in current density in turn leads to increase in high current hotspots, and/or large localized current transients.

In the prior art, typically, the top two metal layers of a silicon die are employed to collect the operating current and connect it to the C4 bumps (C4=controlled collapse chip collection). The C4 bumps in turn couple the operating current to the die-package interface of the packaging. Further, in addition to being employed to collect the operating current, the top two metal layers are also used for signal routing.

To accommodate the possible use for signal routing, typically, relatively thin metal wires are used. The relatively thin metal wires are typically organized in a lattice like arrangement, e.g. with the metal wires in the top metal layer arranged longitudinally, and the metal wires in the next metal layer arranged latitudinally. The C4 bumps disposed in the top metal layer are typically arranged in what is known as a "hexagonal" arrangement (a name derived from the relative locations of the neighboring bumps). Viewed from another perspective, the C4 bumps may also be described as being organized in a shifted or offset row/column manner. Due in substance to the relative dimensions of the metal wires and bumps, typically, not all metal wires will connect to a bump.

Experience has shown that the C4 bumps in general do not scale down correspondingly as the technology scale down. Resultantly, the prior art metallization and bump arrangement scheme is expected to have difficulty in handling the expected increase in current density, and the resulting increase in high current hotspots and/or localized current transients.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION OF ILLUSTRATIVE EMBODIMENTS

Illustrative embodiments of the present invention include, but are not limited to a die, a package to interface with the die, and/or a system having the die and the package.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise.

Figure 1:
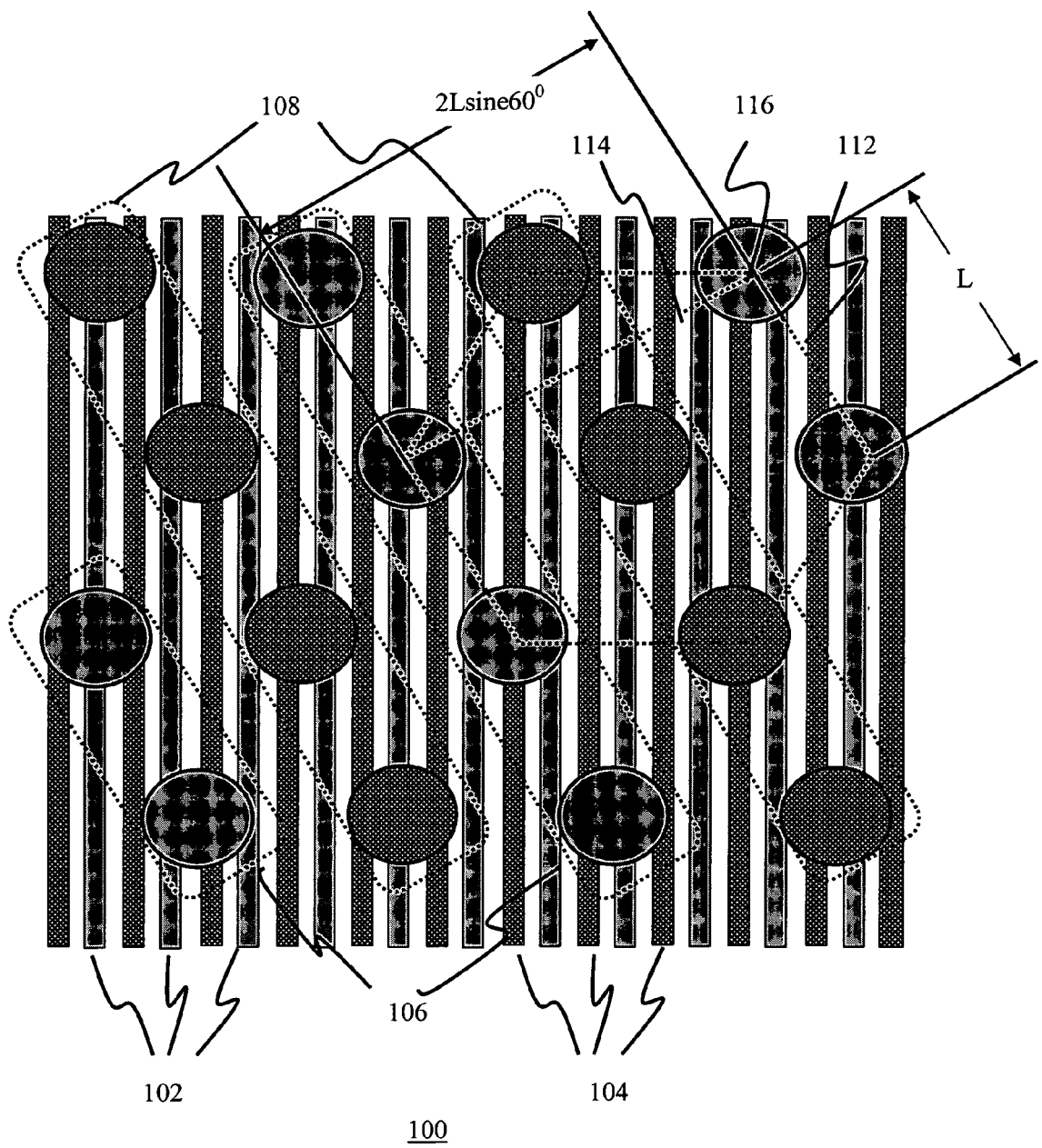
FIG. 1 illustrates a simplified top view of a top metal layer of a die, in accordance with one embodiment of the present invention.

Referring now to FIG. 1, wherein a simplified top view of a top metal layer of a die, in accordance with one embodiment, is shown. As illustrated, top metal layer 100 includes linear wires 102-104 and C4 bumps 106-108. As will be described in more detail below, linear wires 102-104 and C4 bumps 106-108 are adapted and arranged to enable top metal layer 100 to handle the bulk or all the global current burden, leaving other layers of the die (not shown) to primarily or exclusively handle local power delivery current and signals.

For the embodiment, linear wires 102 are principally designed for a first current related usage (e.g. Vcc), while linear wires 104 are principally designed for a second current related usage (e.g. Vss). In other words, linear wires 102-104 are principally designed for handling collection of operating current. Further, as illustrated, for the embodiment, linear wires 102-104 are interleavingly disposed in a longitudinal arrangement. Note that the reference to the arrangement as a longitudinal arrangement is merely for ease of understanding. The arrangement may be referred to as a latitudinal arrangement, if the view is rotated 90 degrees. Thus, the reference should not be read as limiting on the invention.

Similarly, for the embodiment, linear arrangements 106 of C4 bumps are designed for the first current related usage, and linear arrangements 108 of C4 bumps are designed for the second current related usage. As illustrated, for the embedment, linear arrangements 106-108 of C4 bumps are interleavingly disposed on linear wires 102-104 in a diagonal arrangement. Viewed from a neighboring bump perspective, C4 bumps 106-108 may also be described as being arranged in a "hexagonal" arrangement 116, except the "hexagonal" arrangement 116, when compared to the prior art, is rotated approximately 60 degrees.

In various embodiments, by virtue of the fact that linear wires 102-104 are designed to handle current only, wider and/or thicker linear wires (as compared to the prior art) may be employed. In various embodiments, the width of linear wires 102-104 may be about 10 micron, i.e. about 10× the typical width employed for prior art metal wires of the top metal layer. In various embodiments, the thickness of linear wires 102-104 is likewise increased to about 10 micron, i.e. by about 10× the typical thickness employed for prior art metal wires of the top metal layer.

In various embodiments, by virtue of the "hexagonal" arrangement (rotated), the relative positions of C4 bumps 106-108 are governed by the length ratio of side 112 and segment 114 of the "hexagon", which is kept at L to 2L×sine 60°.

Further, the width of linear wires 102-104, the pitch of C4 bumps 106-108 and their offsets, L, are complementarily coordinated, such that every wire (or nearly every wire) will connect to a row or a column of the C4 bumps.

Thus, by so adapting and arranging linear wires 102-104 and C4 bumps 106-108, the elements may be employed to handle the bulk or all of the global current burden. In turn, top metal layer 100 may become a predominantly power-handling layer as desired, leaving other layers of the die (not shown) to primarily or exclusively handle signals and localized current (which tends to be smaller than global current).

Figure 2:
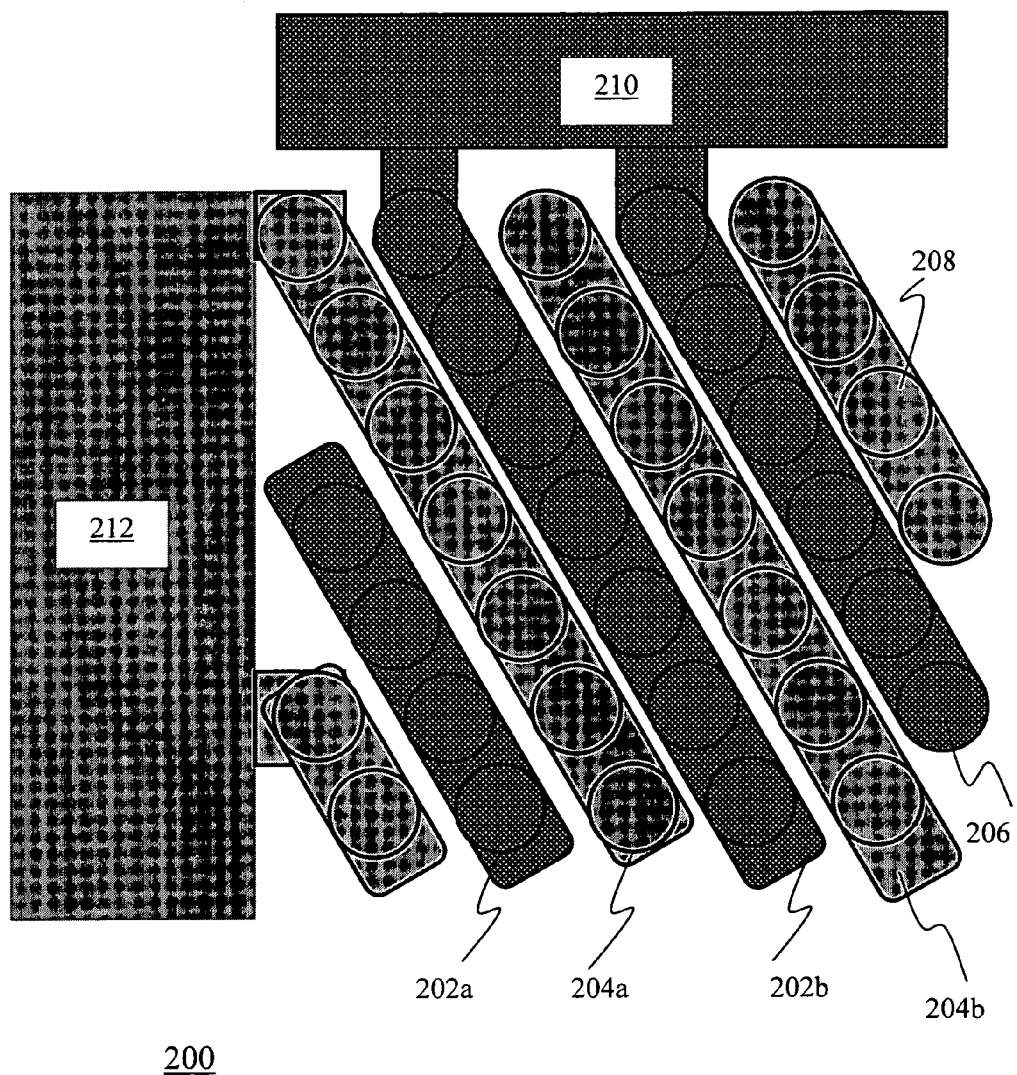
FIG. 2 illustrates a simplified partial top view of a complementary die-package interface layer.

FIG. 2 illustrates a simplified partial view of a complementary die-package interface layer for interfacing a die having the top metal layer of FIG. 1 to a package, in accordance with one embodiment. More specifically, FIG. 2 is a simplified partial view of the top left corner of the complementary die-package interface layer. As before, the reference to the illustrated portion of the die-package interface layer as the top left corner is merely for ease of understanding. The illustrated portion may also be referred to as the lower left portion, lower right portion, or top right portion, if the viewing perspective is rotated 90 degrees, 180 degrees or 270 degrees respectively. Thus, the reference is not to be read as limiting on the invention.

As illustrated, for the embodiment, die-package interface layer 200 includes complementary linear wires 202a-202b and 204a-204b. Linear wires 202a-202b are designed for the first current related usage (e.g. Vcc), whereas linear wires 204a-204b are designed for the second current related usage (e.g. Vss).

For the embodiment, linear wires 202a-202b emanate diagonally from either side 210 or its counterpart opposite side (not shown), whereas linear wires 204a-204b emanate diagonally from either side 212 or its counterpart opposite side (not shown). Diagonally emanating linear wires 202a-202b and diagonally emanating linear wires 204a-204b are interleavingly disposed, relative to each other. In alternate embodiments, it is possible to rotate the arrangement of interleavingly disposed wires 202a-202b and 204a-204b by 90 degrees. Thus, the reference is not to be read as limiting on the invention. Additionally, the 90 degree rotation embodiment, may employ narrow wires, which would increase resistance but lower inductance compared to the wires of the earlier embodiments shown. In other words, in different embodiments, different relative values of inductance and resistance can be employed to trade off and optimize the power delivery for higher or lower frequency response. Further, in alternate embodiments, it is also possible to stretch the arrangements illustrated in FIGS. 1 and 2 either latitudinally or longitudinally, while keeping substantially the same arrangement of bumps, die wires, and package wires. Such a stretched arrangement is usually referred to as a face-centered rectangular array rather than a hexpack array. Although such a stretch would change some of the angles mentioned throughout this text, it would still be within the scope of the present invention.

Further, lands or land pads 206 and 208 designed for corresponding current related usages are correspondingly disposed on linear wires 202a-202b and 204a-204b respectively. Viewed from the neighboring lands or land pads' perspective, lands or land pads 206 and 208 may also be said to have a "hexagonal" arrangement, except it too is complementarily rotated 60 degrees.

The pitch and the relative locations of lands or land pads 206 and 208 are complementarily coordinated with the pitch and relative locations of C4 bumps 106 and 108 of the top metal layer of a die to be mated with die-package interface layer 200. Note that lands or land pads 206 and 208 may also be referred to as bumps.

The novel metallization and bump pattern design and arrangement (hereinafter simply, arrangement) may yield a number of benefits. First among them, the arrangement may yield many more useable global tracks for power routing. The arrangement may provide lower IR drop. The arrangement may provide lower DC power delivery impedance and/or lower lateral AC impedance. The arrangement may provide lower peak current (Imax) per bump. The arrangement may provide lower current density in the power delivery wires. The arrangement may provide more useable signal tracks in lower metal layers by reducing the number of tracks dedicated to power routing. The arrangement may provide improved accessibility to the power rails along each side of a die.

Figure 3:
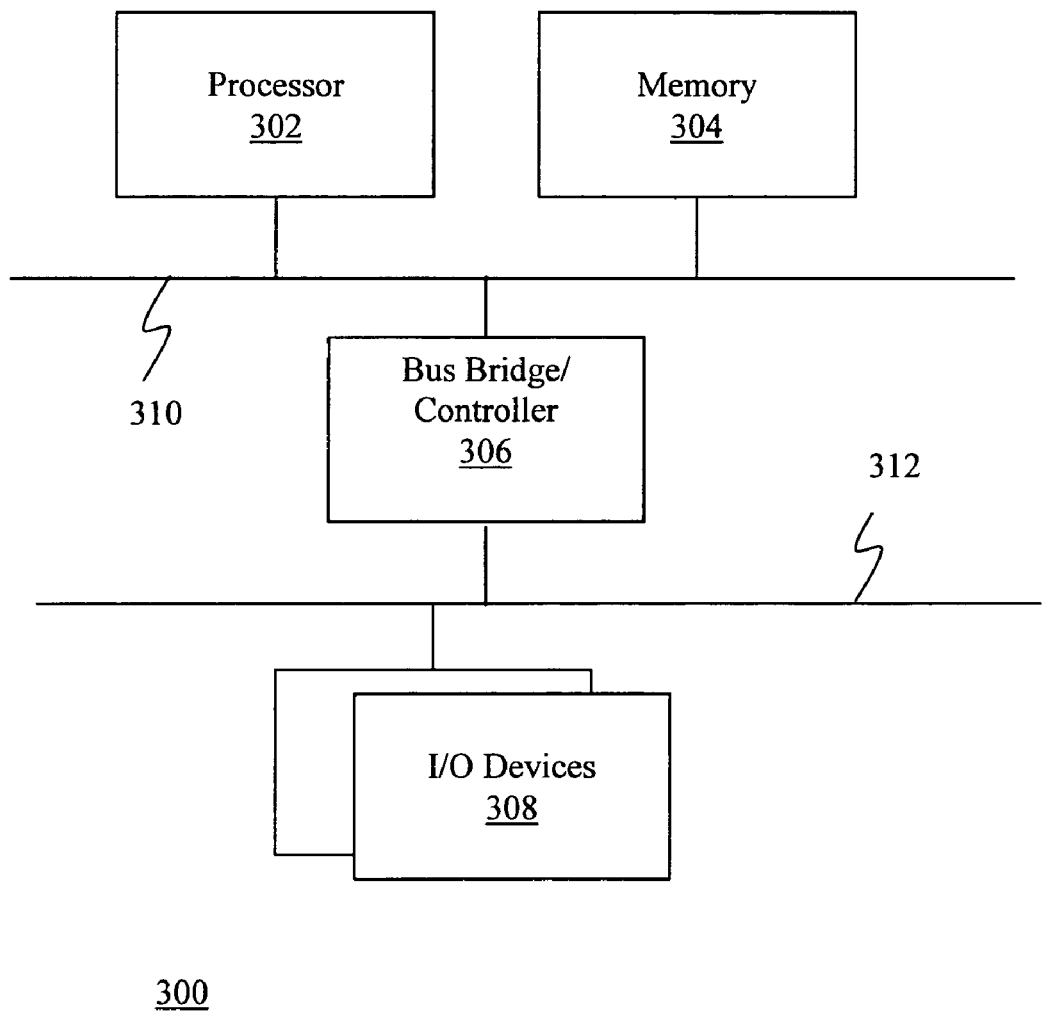
FIG. 3 illustrates an example system having a package incorporated with a die and/or a die-package interface layer of FIGS. 1 and 2, in accordance with one embodiment.

FIG. 3 illustrates an example system having an integrated circuit package incorporated with the die and die-package interface metallization and bump design/arrangement of FIGS. 1-2, in accordance with one embodiment. As illustrated, example system 300 includes microprocessor 302, memory 304, bus bridge 306 and a number of I/O devices 308, coupled to each other via buses 310-312.

At least one of elements 302-308, e.g. microprocessor 302 and/or bus bridge 306, incorporates the die and die-package interface metallization and bump design/arrangement of FIGS. 1-2. Except for the incorporation of the die and die-package interface metallization and bump design/arrangement of FIGS. 1-2, elements 302-312 may be a broad range of these elements known in the art or to be designed. In particular, examples of I/O devices 308 may include but are not limited to keyboard, pointing devices, display, mass storage, communication/networking interfaces (both wire line based or wireless), and so forth.

In various embodiments, example system 300 may be a server, a desktop computer, a laptop computer, a tablet computer, a hand held computing device, and so forth. In other embodiments, example system 300 may be a set-top box, a CD player, a DVD player, a digital camera, a digital camcorder, a wireless mobile phone, and so forth.

Thus, a novel die and die-package interface layer metallization and bump design and arrangement, and an example application have been described. Although specific embodiments have been illustrated and described herein, it will be appreciated by those of ordinary skill in the art that a wide variety of alternate and/or equivalent implementations may be substituted for the specific embodiments shown and described. This application is intended to cover any adaptations or variations of the embodiments discussed herein. Therefore, it is manifestly intended that this invention be limited only by the claims and the equivalents thereof.

What is claimed is:

1. An integrated circuit, comprising:
   a top metal layer;
   a first and a second plurality of linear wires designed for a first and a second corresponding current related usage, interleavingly disposed on the top metal layer in a selected one of a longitudinal and a latitudinal arrangement;

a first and a second plurality of linear arrangements of bumps designed for the first and second corresponding current related usages, interleavingly disposed on the first and second plurality of wires in a diagonal arrangement; and wherein each of the first and second plurality of linear wires has a width of about 10 microns.

2. The integrated circuit of claim 1, wherein the first and second related usages are Vcc and Vss respectively.

3. The integrated circuit of claim 1, wherein each of the first and second plurality of linear wires has a thickness of about 10 microns.

4. The integrated circuit of claim 1, wherein the first and second bumps comprise controlled collapse chip connection bumps.

5. The integrated circuit of claim 1, wherein the first and second current related usages are Vcc and Vss respectively.

6. An integrated circuit, comprising:
a top metal layer;
a first and a second plurality of linear wires designed for a first and a second corresponding current related usage, interleavingly disposed on the top metal layer across a direction;
a plurality of linear interleaving arrangements of bumps designed for the first and second corresponding current related usages disposed on the first and second plurality of wires having an assignment along the direction which substantially alternates between the first and second current related usages; and
wherein each of the first and second plurality of linear wires has a width of about 10 microns.

7. The integrated circuit of claim 6, wherein each of the first and second plurality of linear wires has a thickness of about 10 microns.

8. The integrated circuit of claim 6, wherein the first and second bumps comprise controlled collapse chip connection bumps.

9. A semiconductor package comprises
a die-package interface layer;
a first and a second plurality of linear wires designed for a first current related usage, diagonally emanating from a first and a second opposite side of the die-package interface layer; and
a third and a fourth plurality of linear wires designed for a second current related usage, diagonally emanating from a third and a fourth opposite side of the die-package interface layer, orthogonal to the first and second opposite sides.

10. The semiconductor package of claim 9, wherein the first and second current related usages are Vcc and Vss respectively.

11. The semiconductor package of claim 9, wherein the semiconductor package further comprises a first and a second plurality of arrangements of lands designed for the first current related usage correspondingly disposed on the first and second plurality of linear wires, and a third and fourth plurality of arrangements of lands designed for the second current related usage correspondingly disposed on the third and fourth of plurality of linear wires.

12. The semiconductor package of claim 11, wherein the lands are adapted to complement controlled collapse chip connection bumps.

13. A semiconductor package comprises
a die-package interface layer;
a first plurality of linear wires designed for a first current related usage, diagonally emanating from a first side of the die-package interface layer;
a first plurality of arrangements of lands designed for the first current related usage correspondingly disposed on the first plurality of linear wires;
a second plurality of linear wires designed for a second current related usage, diagonally emanating from a second side of the die-package interface layer, orthogonal to the first side; and
a second plurality of arrangements of lands designed for the second current related usage correspondingly disposed on the second plurality of linear wires.

14. The semiconductor package of claim 13, wherein the first and second current related usages are Vcc and Vss respectively.

15. The semiconductor package of claim 13, wherein the lands are adapted to complement controlled collapse chip connection bumps.

16. A system comprising:
a semiconductor package including
a die having a top metal layer, a first and a second plurality of linear wires designed for a first and a second corresponding current related usage, interleavingly disposed on the top metal layer in a selected one of a longitudinal and a latitudinal arrangement, and a first and a second plurality of linear arrangements of bumps designed for the first and second corresponding current related usages, interleavingly disposed on the first and second plurality of wires in a diagonal arrangement, wherein each of the first and second plurality of linear wires has a width of about 10 microns; and
a bus coupled to the semiconductor package; and
a networking interface coupled to the bus.

17. The system of claim 16, wherein the semiconductor package further comprises a die-package interface layer, a first plurality of linear wires designed for the first current related usage, diagonally emanating from a first side of the die-package interface layer, a first plurality of arrangements of lands designed for the first current related usage correspondingly disposed on the first plurality of linear wires, a second plurality of linear wires designed for the second current related usage, diagonally emanating from a second side of the die-package interface layer, orthogonal to the first side, and a second plurality of arrangements of lands designed for the second current related usage correspondingly disposed on the second plurality of linear wires.

18. The system of claim 16, wherein the semiconductor package comprises a microprocessor.

19. The system of claim 16 wherein the system is select from a group consisting of a set-top box, a digital camera, a digital versatile disk player, and a compact disc player.

* * * * *